(12) United States Patent
Barnham

(10) Patent No.: US 6,476,312 B1
(45) Date of Patent: Nov. 5, 2002

(54) RADIATION CONCENTRATOR FOR A PHOTOVOLTAIC DEVICE

(75) Inventor: Keith WJ Barnham, London (GB)

(73) Assignee: Imperial College of Science, Technology and Medicine, London (GB)

(*) Notice: Subject to any disclaimer, the term of this patent is extended or adjusted under 35 U.S.C. 154(b) by 0 days.

(21) Appl. No.: 09/936,209

(22) PCT Filed: Mar. 10, 2000

(86) PCT No.: PCT/GB00/00884
§ 371 (c)(1),
(2), (4) Date: Jan. 2, 2002

(87) PCT Pub. No.: WO00/54340
PCT Pub. Date: Sep. 14, 2000

(30) Foreign Application Priority Data

Mar. 11, 1999 (GB) .............................. 9905642

(51) Int. Cl.[7] ............... H01L 31/055; H01L 31/052; G02F 1/35
(52) U.S. Cl. ............ 136/247; 136/248; 136/246; 136/259; 136/291; 250/227.11; 250/216; 250/227.28; 385/900
(58) Field of Search ............... 136/247, 248, 136/246, 259, 291; 250/227.11, 216, 227.28; 385/900

(56) References Cited

U.S. PATENT DOCUMENTS

| | | | | |
|---|---|---|---|---|
| 5,260,957 A | * | 11/1993 | Hakimi et al. | 372/39 |
| 5,500,054 A | * | 3/1996 | Goldstein | 136/253 |
| 5,881,200 A | * | 3/1999 | Burt | 385/142 |
| 6,322,901 B1 | * | 11/2001 | Bawendi et al. | 428/548 |

OTHER PUBLICATIONS

Medeiros Neto et al, "Quantum size effects on CdTexS1–x semiconductor–doped glass," Applied Physics Letters, vol. 59, No. 21, Nov. 18, 1991, pp. 2715–2717.*
Schmidt et al "Size quantization effects in InAs self–assembled quantum dots," Appl. Phys. Lett. vol. 70, No. 13, Mar. 31, 1997, pp. 1727–1729.*
Lu et al, "Effect of growth interruption on the optical properties of InAs/GaAs quantum dots," Solid State Communications, vol. 109, No. 10, Feb. 19, 1999, pp. 649–653.*
Barnham et al, "Quantum–dot concentrator and thermodynamic model for the global redshift," Applied Physics Letters, vol. 26, No. 9, Feb. 28, 2000, pp. 1197–1199.*
Medeiros Neto et al, Quantum size effects on $CdTe_xS_{1-x}$ semiconductor–doped glass, Applied Physics Letters, vol. 59, No. 21, Nov. 18, 1991, pp. 2715–2717.
Micic et al, "Highly efficient band–edge emission from InP quantum dots", Applied Physics Letters, vol. 68, No. 22, May 27, 1996, pp. 3150–3152.
Schmidt et al, "Size quantization effects in InAs self–assembled quantum dots", Applied Physics Letters, vol. 78, No. 13, Mar. 31, 1997, pp. 1727–1729.
Greenham et al, "Charge separation and transport in conjugated–polymer/semiconductor–nanocrystal composites studied by photoluminescence quenching and photoconductivity", Physical Review, B. Condensed Matter, vol. 54, No. 24, Dec. 15, 1996, pp. 17628–17637.

(List continued on next page.)

Primary Examiner—Alan Diamond
(74) Attorney, Agent, or Firm—Nixon & Vanderhye P.C.

(57) ABSTRACT

Concentrator for use with photovoltaic devices includes a waveguide (2) incorporating quantum dots. The quantum dots red-shift the incident radiation to produce red-shifted radiation which is internally reflected within the waveguide (2). A photovoltaic device (10) converts the red-shifted radiation to electrical energy.

17 Claims, 4 Drawing Sheets

OTHER PUBLICATIONS

Tokizaki et al, "Linear and nonlinear optical properties of CdSe microcrystallites in glasses", Journal of Crystal Growth, vol. 117, No. 1/04, Feb. 2, 1992, pp. 603–607.

Alvisatos, "Perspectives on the Physical Chemistry of Semiconductor Nanocrystals", Journal of Physical Chemistry, vol. 100, No. 31, Aug. 1996, pp. 13226–13239.

Reisfeld et al, "Photostable solar concentrators based on fluorescent glass films", Solar Energy Materials and Solar Cells, vol. 33, No. 4, Aug. 1, 1994, pp. 417–427.

Barnham et al, quantum–dot concentrator and thermodynamic model for the global redshift, Applied Physics Letters, vol. 76, No. 9, Feb. 28, 2000, pp. 1197–1199.

* cited by examiner

RADIATION CONCENTRATOR FOR A PHOTOVOLTAIC DEVICE

BACKGROUND OF THE INVENTION

1. Field of the Invention

This invention relates to a radiation concentrator for a photovoltaic device.

2. Discussion of Prior Art

Light concentrators can reduce considerably the cost of electricity from photovoltaic (PV) cells. Unfortunately, conventional high concentration techniques require solar tracking, which can be expensive, and utilise only the direct component of radiation. In the late 1970's a novel type of collector, the luminescent (or fluorescent) collector, was extensively investigated [see References 1, 2, 3], consisting of a transparent sheet doped with appropriate organic dyes. The sunlight is absorbed by the dye and then re-radiated isotropically, ideally with high quantum efficiency (QE), and trapped in the sheet by internal reflection. The trapped light is converted at the edge of the sheet by a PV cell operating at optimum efficiency with band-gap just below the luminescent energy. The excess photon energy is dissipated in the collector by the luminescent red-shift (or Stokes' shift) rather than in the cell where heat reduces efficiency. Furthermore, a stack of sheets doped with different dyes [see Reference 2] can separate the light, as in FIG. 1 of the accompanying drawings, and cells can be chosen to match the different luminescent wavelengths.

The advantages over a geometric concentrator are that solar tracking is unnecessary, the material is cheap and both direct and diffuse radiation can be collected [see References 3, 4]. In addition, such concentrators are not limited by phase-space conservation i.e. Liouville's Theorem [see References 5, 6], in contrast to geometric concentrators [see Reference 7].

The development of these known concentrators was limited by practicalities such as, firstly, the stringent requirements on the dye, namely high QE, suitable absorption spectra and red-shifts and stability under illumination [see References 5, 8]. The second limitation was the need for transparent host materials at the luminescent wavelengths and thirdly the absence of high efficiency PV cells of suitable band-gap. Concentration ratios of 10× were achieved [see Reference 5]. A typical measured electrical efficiency with a two-stack concentrator with GaAs solar cells was 4% [see Reference 5], whereas the original predictions were in the range 13–23% [see Reference 2].

SUMMARY OF THE INVENTION

Viewed from one aspect the present invention provides a radiation concentrator for use with a photovoltaic device, said radiation concentrator comprising: a wave-guide containing a plurality of quantum dots, incident radiation upon said quantum dots being red-shifted by said quantum dots to form red-shifted radiation and said red-shifted radiation being internally reflected within said wave-guide to a wave-guide output, said wave-guide being formed of a material substantially transparent to said red-shifted radiation.

The use of quantum dots greatly improves the practicality of a luminescent solar concentrator. Certain properties of quantum dots, in particular their luminescent efficiency, tunability of absorption thresholds and size of red-shifts, make them good replacements for the organic dyes which limit the performance of this inexpensive, concentrator technology. Furthermore, the use of dielectric wave-guide technology and photo-voltaic cells, in particular the ability of quantum well cells to tune the band-gap, also mean that high overall efficiency is possible in solar and thermophotovoltaic applications.

A thermodynamic model may be used to show that red-shifts are determined by the spread of dot sizes. The model can also be used to improve concentrator performance.

BRIEF DESCRIPTION OF THE DRAWINGS

Embodiments of the invention will now be described, by way of example only, with reference to the accompanying drawings in which.

DETAILED DISCUSSION OF EMBODIMENTS

We describe herein a new type of luminescent concentrator, the quantum dot concentrator (QDC) which addresses the problems of the prior art. Recent progress in the growth of nanocrystalline semiconductors, by colloidal [see Reference 9] or single-molecule precursor [see Reference 10] techniques, make quantum dots (QDs) a good replacement for luminescent dyes. Such fabrication techniques are suited to mass-production and lead to low costs. Furthermore, as the dots themselves are semiconductor material, in a suitable medium they degrade less in sunlight than organic dues.

An important advantage of QDs over dyes is the ability to tune the absorption threshold simply by choice of dot diameter. Colloidal InP quantum dots, separated by dot size, have been shown to have thresholds which span the 1.5–2.4 eV energy range and hence the optical spectrum [see Reference 11]. In addition colloidal InAs dots can sample infra-red wavelengths [see Reference 12]. A further major advantage is that high luminescence QE is observed at room temperature. Colloidal CdSe/CdS heterostructure dots have demonstrated luminescence quantum yields above 80% at room temperature [see Reference 12]. It is particularly advantageous that well-separated, luminescent peaks and absorption thresholds have been observed. In Reference 11 the magnitude of the "global" red-shift (the shift when illuminating well above absorption threshold) is comparable with the more optimistic of the two assumptions made in the original calculations of efficiency [see Reference 2]. The radiation concentrators described herein recognise that red-shifts are determined by the spread of dot sizes and hence can be matched to the PV devices by choice of growth conditions. This is a very significant improvement compared to the dye-concentrator.

The authors of Reference 11 argue that the bulk of the global red-shift results from the effects of the finite distribution of dot sizes. The "single-dot" red-shifts extracted from their data are considerably smaller. We have used the thermodynamic model, which was applied by Yablonovitch [see Reference 6] to the original dye-concentrators, to support this interpretation.

Yablonovitch applied a detailed balance argument to a single sheet luminescent concentrator to find an integral relationship for the sum of absorbed and self-absorbed luminescent intensity in terms of the QE of the luminescent process, the chemical potential $\mu$, and the frequency dependence of the absorption cross section $\sigma(v)$. Assuming that $\mu$ does not depend on x, Yablonovitch provided an expression for the luminescent intensity $I_2$ at an arbitrary position x in the concentrator, $$I_2(v, x) = \frac{8\pi n^2 v^2}{2c^2} e^{(\mu-hv)/kT} \frac{\Omega_2}{4\pi}(1 - e^{-N\sigma(v)x}) \quad (1)$$

where n is the refractive index of the medium and $\Omega_2$ is the solid angle of the internally reflected component of the luminescence.

Figure 4:
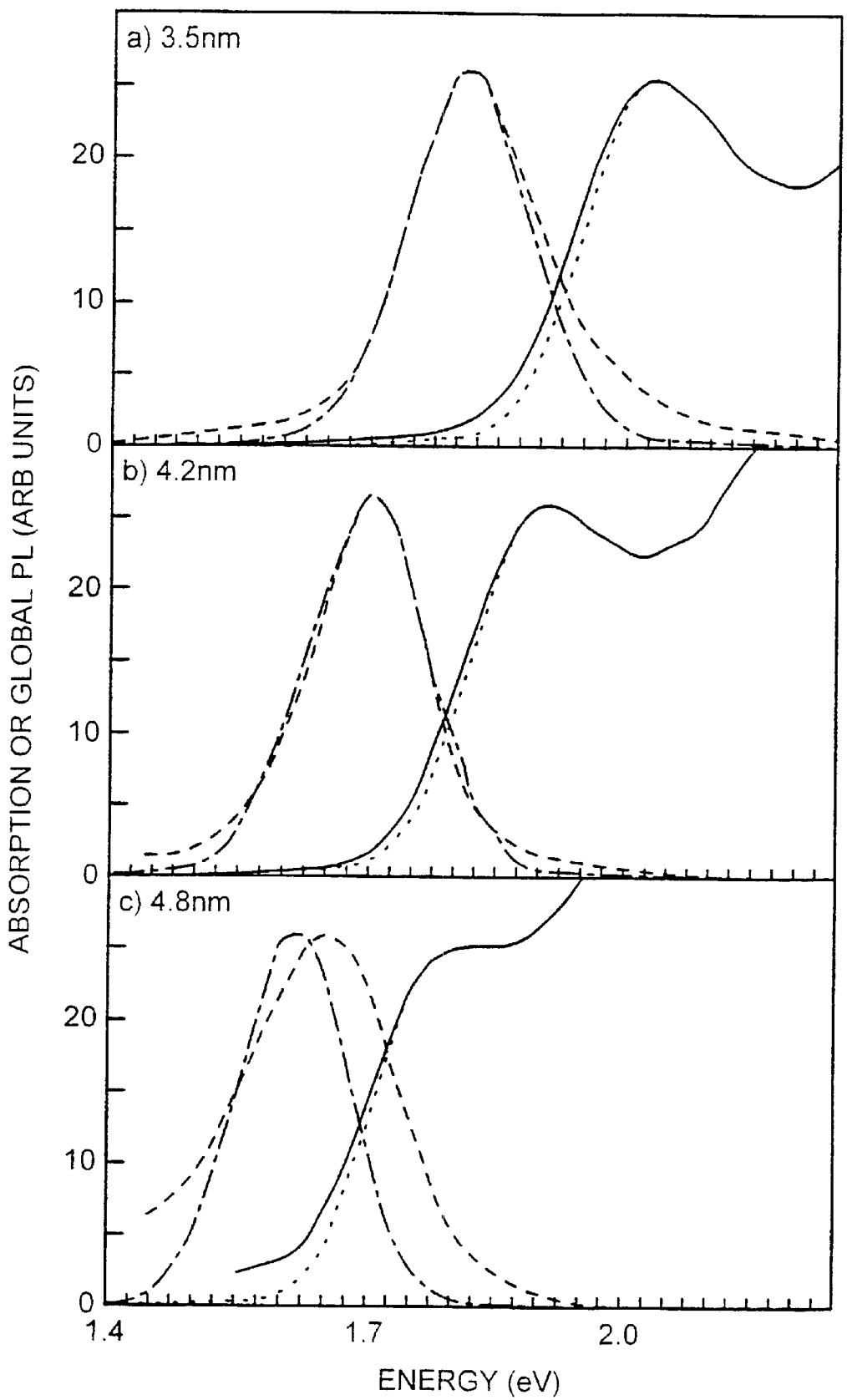
FIG. 4 illustrates measured absorption and global luminescence for quantum dots.

We find that this thermodynamic approach of Yablonovitch can be extended to the global illumination of an ensemble of QDs with a finite range of diameters. The shape and position of the luminescence peak given by $I_2$ in equation 1, and hence the magnitude of the red-shift. depend critically on only two factors namely the shape of the absorption cross section $\sigma(v)$ near threshold and on the temperature T. It does not depend strongly on $\mu$ or the absolute value of $\sigma(v)$. The energy dependence of $\sigma(v)$ at the threshold in the data in Reference 11 is approximately Gaussian, which is consistent with the authors' observation that the diameters of the dots are Gaussian distributed. In fitting the position and shape of the luminescence peaks with equation. 1 the absorption threshold in $\sigma(v)$ must fall to zero at low v at least as strongly as Gaussian, in order to counteract the exp(-hv/kT) term. Typical examples of the fits obtained with equation 1 by simply varying $\sigma(v)$ are shown in FIG. 4. Reasonable fits can be obtained to the peak position and shape of the luminescence signals as in FIGS. 4a and 4b, providing the Gaussian describing the absorption threshold is somewhat narrower than the data indicates. The fits are poor in the tails of the luminescence, which may indicate contributions from impurities.

In some data sets in Reference 11, for example in FIG. 4c, it was not possible to fit the luminescence peak in either shape or position, even if T was allowed to rise from its nominal 298K. However, in these cases, and in FIGS. 4a and 4b when fitted $\sigma(v)$ more closely approximates to the data, the feature is that the thermodynamic model predicts a larger red-shift than observed. It could be that the absorption was measured at a lower illumination intensity and in that dynamic effects such as state-filling may affect the global illumination. Calculations indicate that with a typical solar spectrum the model predicts similar red-shifts to the theoretical ones in FIG. 4, i.e. comparable to, or larger than, those observed in Reference 11.

The approximate agreement between the observed red-shifts and the Yablonovitch model supports the interpretation that they are determined primarily by the distribution of QD sizes which in turn are determined by growth conditions. In addition, this model can be used to predict the absolute luminescence intensity in terms of the QE and $\mu$ where the latter is determined by the integral relationship in Reference 6. Hence the model can be used to improve concentrator efficiency.

The medium in which the dots are to be embedded is important. Ideally the incorporation process should not degrade the high, room temperature QEs observed in colloids and liquids. Incorporation into clear plastics does not appear to be a problem though the dots might degrade less under illumination in glass or silicon dioxide. Glasses doped with II–VI semiconductors have been used as filters for some time and formed the first example of a QD system [see Reference 13]. A problem is that in media with high melting points the dots end up with low radiative efficiency due to the large number of trap states generated. The heterostructure dot of Reference 12 is a good candidate for a suitable surface passivation technique, particularly as the materials concerned, CdS and CdSe are already successfully incorporated into glasses. The approach of Reference 3, in which the dyes were coated onto a glass of similar refractive index, is an alternative.

On example medium to hold the dots would be Solgel (amorphous silicon dioxide). Solgel has the advantage that its refractive index may be adjusted and so matched to a layer of dots applied to a surface of the Solgel. Another example medium to hold the dots would be acrylic plastic. This has a relatively low melting point and so the dots can be embedded within it with a reduced risk of heat damage. Other plastics and glass media may also be used.

The media should be as transparent as possible at the luminescent wavelengths. There has been considerable improvement in the transmission and radiation hardness of doped-plastics used in particle physics detectors since the 1970's. In this respect too, incorporation into glass or silicon oxides would be advantageous, given the improvements in the transparency of optical fibres and dielectric wave-guides in the past two decades.

The interface between the wave-guide and the cells should be considered. In this collector the luminescence hits the exit face of the wave-guide at all angles and therefore cannot be further concentrated in the media of the same refractive index. However, a taper of a transparent medium of higher refractive index, for example nanocrystalline diamond (n=2.4) prepared by chemical vapour deposition, enables a further, useful concentration (~5×) to be made and facilitate the overlapping of different units to avoid shading loss.

The reflection in the interfaces between the low refractive index wave-guide, medium n taper, and high n PV cell is less of a problem than in conventional concentrators. Light emerging at large angles can be effectively transmitted by multi-layer anti-reflection coatings [see Reference 15] and the spectral range is smaller in the QD concentrator.

The QDC are also suitable for thermophotovoitaic (TPV) systems, where the waste, thermal radiation from conventional energy sources is converted directly to electricity with low-band-gap cells [see Reference 16]. Conventional concentrators cannot be used as the cell is close to a source which subtends large angles. However the acceptance angle of a QDC is not restricted [see Reference 4] making them particularly well suited for this application. The QDC may be formed of glass or placed behind glass to assist it in resisting the high temperatures. TPV systems often have reflectors between source and cell to enhance system efficiency be reflecting sub-band-gap radiation. If temperature stable glasses are doped with QDs, then TPV concentration becomes possible.

Finally, PV cells themselves have made great progress over the past two decades. Direct band-gap cells based on III–V systems have external QEs close to unity over a wide range of energies close to threshold. The quantum well solar cell [see Reference 17], (QWSC) is particularly suitable as one can tune the band-gap by changing the well width. Furthermore the absorption at threshold is excitonic, facilitating a good spectral match to the QD luminescence.

The calculations in Reference 2 discussed earlier assumed the output voltage was determined by the voltage factor, the ratio of the open-circuit voltage to the band-gap which is 0.7 near the GaAs band-gap [see Reference 18]. In fact the world's highest efficiency GaAs solar cell has a voltage factor of 0.72 [see Reference 19] and an AlGaAs/GaAs QWSC has a voltage factor of 0.74 [see Reference 20].

Many properties of QDs, in particular the size-dependence of their absorption threshold and red-shift, their luminescent efficiency and likely stability under illumination, make them good replacements for organic dyes in a new type of luminescent concentrator. The thermodynamic model of Reference 6 suggests that QD red-shifts are primarily determined by the spread of QD diameters which can be tailored by the growth conditions. The thermodynamic approach can be also used to predict the efficiency of the QDC. Providing the dots can be incorporated in suitable transparent media and retain their high QE. the improved performance of III–V cells, in particular the QWSC make it possible to provide QDCs which perform in the upper range of efficiency predicted for the original dye-concentrators i.e. above 20%. The ability to collect light at all incident angles makes them well suited for non-equatorial latitudes and TPV applications.

Figure 1:
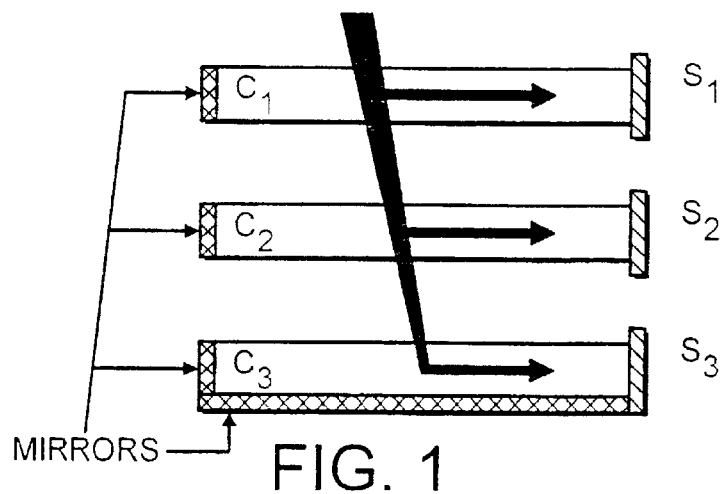
FIG. 1 illustrates a stack of doped sheets acting as a radiation concentrator.
Figure 2:
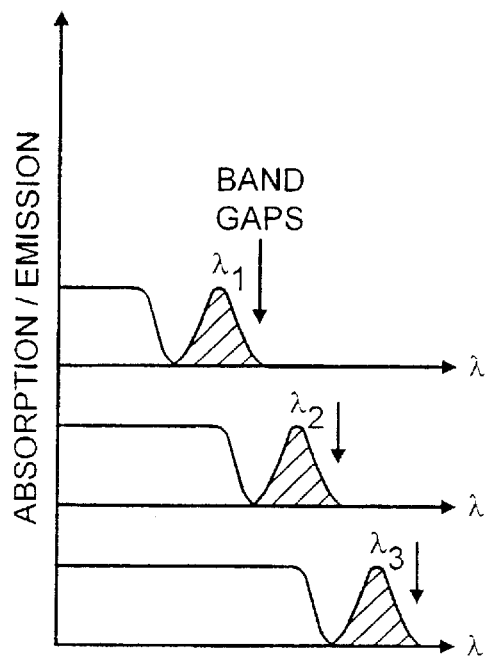
FIG. 2 illustrates absorption and emission spectra.

FIG. 2 illustrates desirable absorption and emission (shaded) spectra of the quantum dots to be used doping the wave-guides. Referring to FIG. 1, wavelengths and $\lambda_1$, $\lambda_2$ and $\lambda_3$ correspond to energies just above the band gaps of the photovoltaic devices $S_1$, $S_2$ and $S_3$ respectively.

Figure 3:
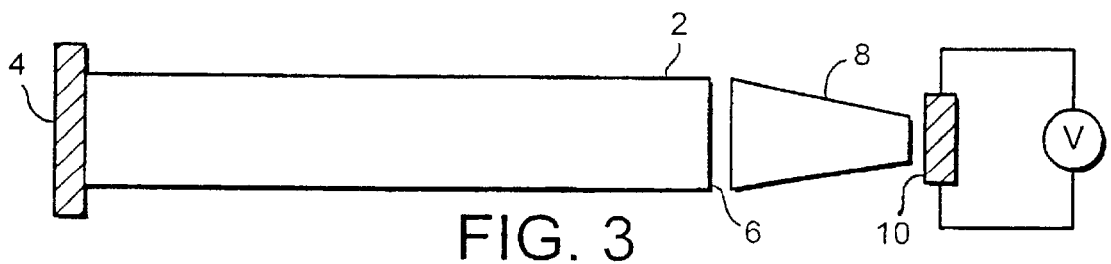
FIG. 3 illustrates a radiation concentrator in accordance with one embodiment of the invention.

FIG. 3 illustrates a radiation concentrator in more detail. Incident light is received by the waveguide 2. Quantum dots within the waveguide 2 absorb the incident radiation and emit it at a red-shifted wavelength. This red-shifted radiation is internally reflected within the waveguide 2. A mirror 4 at one end of the waveguide stops light emerging from that end. A waveguide output 6 is disposed against a taper element 8. The taper element 8 is formed of nanocrystalline diamond and serves to further concentrate the red-shifted radiation down towards a photovoltaic device 10. The transmission surfaces at the waveguide output 6 and elsewhere may be subject to multilayer antireflective coatings. The photovoltaic device 10 may be a quantum well photovoltaic device or a direct band-gap photovoltaic device. Electrical energy is generated by the photovoltaic device 10.

The waveguide 2 may be solid with the quantum dots embedded within it. Alternatively, the wave-guide 2 may be liquid filled with the quantum dots suspended within the liquid. A further alternative is that the quantum dots may be formed on a surface of the wave-guide. Such surface formation and suspension within liquid of the quantum dots is well suited to their modes of production. In any event the wave-guide 2 should be substantially transparent to the red-shifted radiation.

As well as being formed of the various materials discussed above, the quantum dots may also be formed of one or more of $CuInSe_2$, a Group II/VI heterostructure or a Group III/V heterostructure. Mixing more than one species (type) of dot in the QDC may also be used to help match the properties of the QDC to the incident radiation and the photovoltaic device.

FIG. 4 illustrates data on measured absorption (full line) and global luminescence (broken line) taken from Ref. 10. The fits (dot-dash line) to the luminescence peak were made with the thermodynamic model of Reference 6 assuming an absorption spectrum $\sigma(v)$ given by the dotted line. The temperature was fixed at 298K [see Reference 11] and, as the data are relative, the value of $N\sigma(v)x$ was arbitrarily set to 0.01 (the red-shift is relatively insensitive to this factor). The numbers indicate the mean diameters of the dots.

Figure 5:
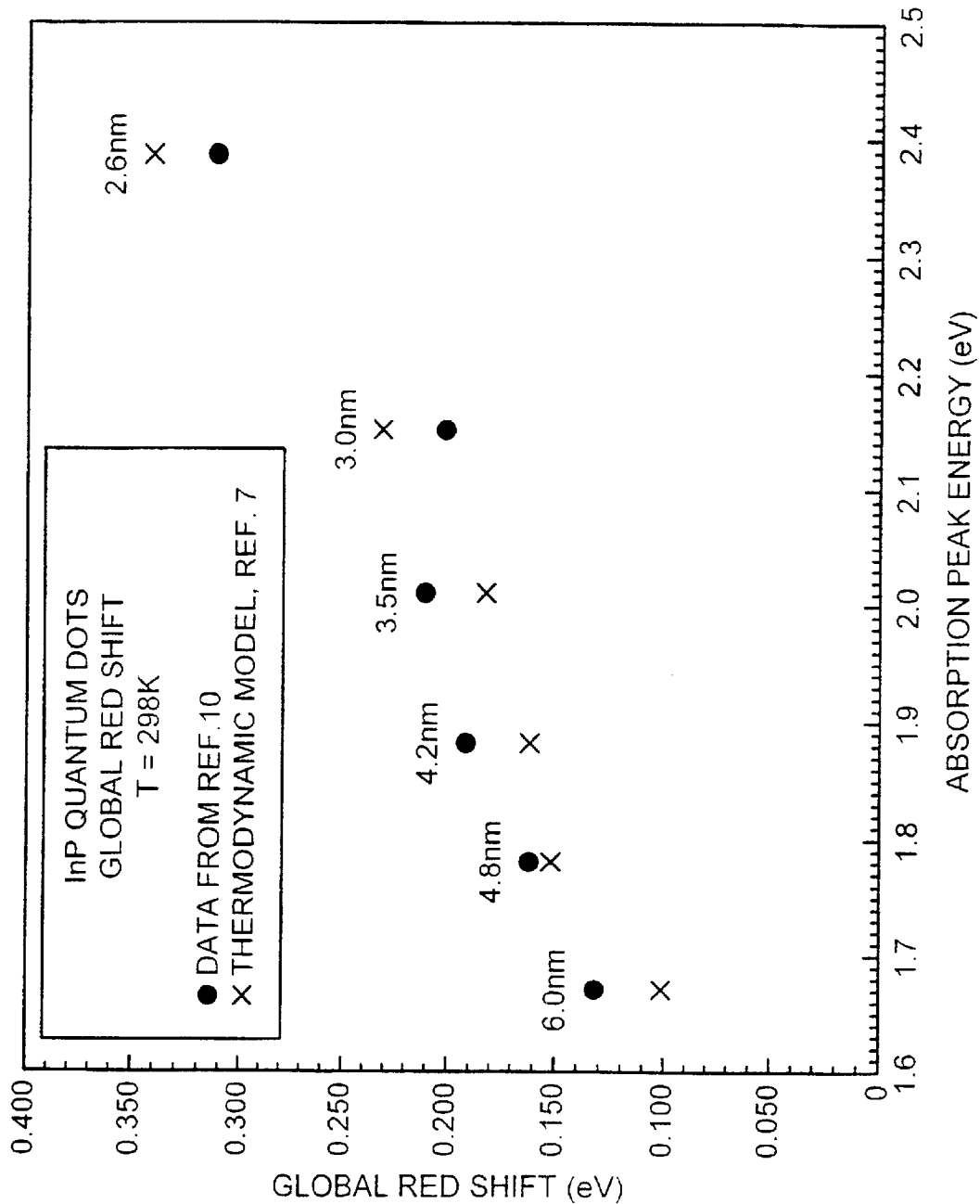
FIG. 5 illustrates the red-shift variation.

FIG. 5 illustrates data on the global red shift (absorption peak energy—luminescence peak energy) for illumination well above absorption threshold, taken from FIG. 1, Reference 11. The crosses indicate the predictions of equation assuming $\sigma(v)$ is given by a Gaussian which fits the threshold in the relevant absorption spectrum.

Figure 6:
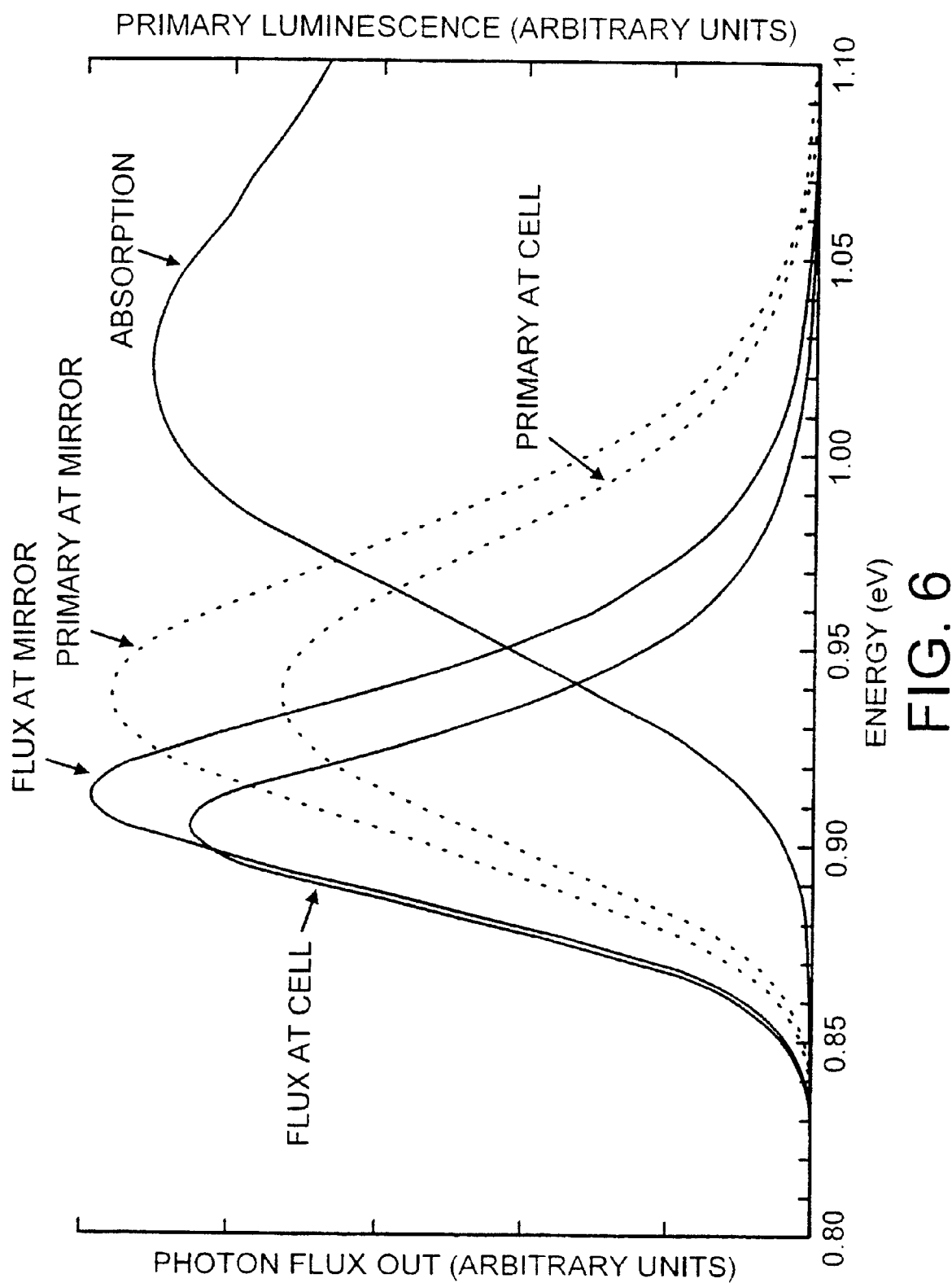
FIG. 6 illustrates the results of a model predicting luminescence.

FIG. 6 illustrates calculations of the primary luminescence (dotted lines) near the mirror and near the solar cell for a single-slab luminescent concentrator (e.g. one layer in FIG. 1) and of the shape of the trapped luminescent flux at the same points following re-absorption (thin lines). The curves are numerical solutions of the thermodynamic model in Reference 6 allowing for re-absorption and the variation of $\mu$ with position and assuming the given absorption curve (thick line).

REFERENCES

1. W. H.Weber and J. Lambe, Appl. Opt., 15, 2299, (1976).
2. A. Goetzberger and W. Greubel, Appi. Phys., 14, 123, (1977).
3. Charles F. Rapp and Normal L. Boling, Proc, 13$^{th}$ IEEE Photovoltaic Specialists Conference, (978), P690.
4. A. Goetzberger, Appi. Phys., 16, 399, (1978).
5. A. Goetzberger, W. Stahl, V. Wittwer, Proc 6$^{th}$ European Photovoltaic Solar Energy Conference, P.209 (1985).
6. E. Yablonovitch, J.Opt.Soc.Am., 70, 1362, (1980).
7. W. T. Welford and R. Winston, "High Collection, Non-Imaging Optics", Academic Press, San Diego (1989).
8. V. Wittwer, K. Heidler, A. Zastrow, A. Goetzberger, J. of Luminescence, 24/25, 873, (1981).
9. Reviewed by Arthur J. Nozik and Olga I. Micic, MRS Bulletin February 1998, P.24.
10. Tito Trinidade, Paul O'Brien and Xiao-mei Zhang, Chemistry of Materials 9, 523, (1997)
11. O. I. Micic, H. M. Cheong, H. Fu, A. Zunger, J. R. Sprague, A. Mascarenhas and A. J. Nozik, J. Phys,Chem. B,101, 4904, (1997).
12. A. P. Alivisatos, MRS Bulletin, February 1998, P.18.
13. U. Woggon, "Optical Properties of Semiconductor Quantum Dots", Springer-Verlag, Berlin (1997).
14. S. A. Blanton, M. A. Hines, P. Guyot-Sionnest, Appl. Phys. Lett. 69, 3905, (1996).
15. V. Diaz Luque, C. Algora del Valle and I. Rey-Stolle Prado, "Performance and optimisation of very high concentrator GaAs solar cells under wide angle cones of homogeneous light", to be published in Proc. 2$^{nd}$ World Solar Energy Conference and Exhibition (Vienna), 1988.
16. T. J. Coutts and M. C. Fitzgerald, Scientific American, October 1998. P.90.
17. K. W. J. Barnham, B. Braun. J. Nelson, M. Paxman. C. Button, J. S. Roberts, C. T. Foxon,-Appl. Phys. Lett. 59, 135, (1991) and also in International Published Patent Application WO-A-93/08606.
18. M. Wolf. Proc. IRE, 48, 1246, (1960).
19. M. A. Green, K. Emery, K. Buecher, D. L. King and S. Igari. Prog. Photovolt. Res. Appl., 6, 265, (1988).
20. K. W. J. Baniham, J. Connolly, P. Griffin, G. Haarpaintner, J. Nelson, E. S. M. Tsui, A. Zacharious, J. Osbrone, C. C. Button, G. Hill, M. Hopkinson, M. Pate, J. S. Roberts, C. T. Foxon, J. Appli, Physics, 80, 1201, (1996).

What is claimed is:

1. Apparatus for converting incident radiation to electrical energy, said apparatus comprising:
   a radiation concentrator; and
   a photovoltaic device coupled to said concentrator, wherein said radiation concentrator comprises a waveguide containing a plurality of quantum dots, incident radiation upon said quantum dots being red-shifted by said quantum dots to form red-shifted radiation and said red-shifted radiation being internally reflected within said wave-guide to a wave-guide output, said wave-guide being formed of a material substantially transparent to said red-shifted radiation.

2. The apparatus as claimed in claim 1, wherein said wave-guide is formed of one or more of:

clear plastics;

glass;

organic glass;

glass doped with Group IIVI semiconductors; and silicon dioxide.

3. The apparatus as claimed in claim 1, wherein said quantum dots are formed of one or more of:

InP;

InAs;

$CuInSe_2$;

a Group II/VI heterostructure;

a Group III/V heterostructure; and a CdSe/CdS heterostructure.

4. The apparatus as claimed in claim 1, wherein said radiation concentrator includes more than one species of quantum dot.

5. The apparatus as claimed in claim 1, wherein said quantum dots are subject to surface passivation.

6. The apparatus as claimed in claim 1, wherein said photovoltaic device is one of:

a quantum well photovoltaic device;

an AlGaAs/GaAs quantum well photovoltaic device;

a direct band gap photovoltaic device; and a Group III/V direct band gap photovoltaic device.

7. The apparatus as claimed in claim 6, wherein said quantum dots have a spread of sizes selected such that said red-shifted radiation has low overlap with the absorption spectrum of said quantum dots and is matched in wavelength to radiation converted to electrical energy by said photovoltaic device.

8. The apparatus as claimed in claim 1, further comprising a multi-layer antireflective coating at least one interface across which said incident radiation or said red-shifted radiation passes.

9. The apparatus as claimed in claim 1, wherein said quantum dots are disposed within a liquid inside said wave-guide.

10. The apparatus as claimed in claim 1, wherein said quantum dots are disposed as a thin film on a surface of said wave-guide.

11. The apparatus as claimed in claim 1, wherein a taper element receives said red-shifted radiation at a taper input facing said wave-guide output and outputs said red-shifted radiation from a taper output to said photovoltaic device, said taper output having a smaller area than said waveguide output and said taper input.

12. The apparatus as claimed in claim 11, wherein said wave-guide has a refractive index, said photovoltaic device has a refractive index, and said taper element has a refractive index between said wave-guide refractive index and said device refractive index.

13. The apparatus as claimed in claim 11, wherein said taper element is formed of nanocrystalline diamond.

14. A radiation concentrator for use with a photovoltaic device, said radiation concentrator comprising:

a wave-guide containing a plurality of quantum dots, incident radiation upon said quantum dots being red-shifted by said quantum dots to form red-shifted radiation and said red-shifted radiation being internally reflected within said wave-guide to a wave- guide output, said wave-guide being formed of a material substantially transparent to said red-shifted radiation, wherein a taper element receives said red-shifted radiation at a taper input facing said wave-guide output and outputs said red-shifted radiation from a taper output to said photovoltaic device, said taper output having a smaller area than said waveguide output and said taper input.

15. A radiation concentrator as claimed in claim 14, wherein said wave-guide has a refractive index, said photovoltaic device has a refractive index, and said taper element has a refractive index between said wave-guide refractive index and said device refractive index.

16. A radiation concentrator as claimed in claim 14, wherein said taper element is formed of nanocrystalline diamond.

17. A method of converting incident radiation into electrical energy using a radiation concentrator coupled to a photovoltaic device, said method comprising the step of red-shifting said incident radiation in said radiation concentrator to form red-shifted radiation using quantum dots.

\* \* \* \* \*